(12) United States Patent
Kim

(10) Patent No.: US 7,635,629 B2
(45) Date of Patent: Dec. 22, 2009

(54) METHOD OF MANUFACTURING NON-VOLATILE MEMORY DEVICE

(75) Inventor: Se Hoon Kim, Gunpo-si (KR)

(73) Assignee: Hynix Semiconductor Inc., Icheon-si (KR)

(*) Notice: Subject to any disclaimer, the term of this patent is extended or adjusted under 35 U.S.C. 154(b) by 148 days.

(21) Appl. No.: 11/771,969

(22) Filed: Jun. 29, 2007

(65) Prior Publication Data

US 2008/0081451 A1   Apr. 3, 2008

(30) Foreign Application Priority Data

Sep. 29, 2006   (KR) .................. 10-2006-0096011

(51) Int. Cl.
*H01L 21/336* (2006.01)

(52) U.S. Cl. .............. 438/264; 438/257; 438/595; 257/E21.68; 257/E29.129

(58) Field of Classification Search ........ 438/257, 438/264, 595; 257/315, E21.68, E29.129, 257/E29.3
See application file for complete search history.

(56) References Cited

U.S. PATENT DOCUMENTS 6,077,738 A * 6/2000 Lee et al. .............. 438/241

2002/0061616 A1 * 5/2002 Kim et al. .............. 438/200
2006/0035437 A1 * 2/2006 Mitsuhira et al. ........ 438/424
2007/0102731 A1 * 5/2007 Sakagami .............. 257/207

FOREIGN PATENT DOCUMENTS

| KR | 1020010004893   | * | 1/2001 |
| KR | 1020010004893 A |   | 1/2001 |
| KR | 1020010058617 A |   | 7/2001 |
| KR | 1020010059136 A |   | 7/2001 |
| KR | 1020020007865 A |   | 1/2002 |
| KR | 1020030000665 A |   | 1/2003 |
| KR | 1020030010212 A |   | 2/2003 |
| KR | 1020040077044 A |   | 9/2004 |

* cited by examiner

*Primary Examiner*—Thanh V Pham
*Assistant Examiner*—Maria Ligai
(74) *Attorney, Agent, or Firm*—Townsend and Townsend and Crew LLP

(57) ABSTRACT

A method of manufacturing a non-volatile memory device includes forming a conductive layer to form a gate on a semiconductor substrate; forming a hard mask over the conductive layer; patterning the hard mask and the conductive layer of a cell region to form the gate; partially recessing the hard mask using a mask through which a peripheral region is opened; and patterning the recessed hard mask and the conductive layer of the peripheral region to form the gate.

10 Claims, 4 Drawing Sheets

CELL REGION | PERI REGION

CELL REGION | PERI REGION

METHOD OF MANUFACTURING NON-VOLATILE MEMORY DEVICE

CROSS-REFERENCES TO RELATED APPLICATIONS

The present application claims priority to Korean patent application number 10-2006-96011, filed on Sep. 29, 2006, which is incorporated by reference in its entirety.

BACKGROUND OF THE INVENTION

The present invention relates to non-volatile memory devices and, more particularly, to a method of manufacturing a non-volatile memory device with a reduced step between a cell region and a peripheral region.

In general, a non-volatile memory device does not lose information even though the supply of power is turned off. Non-volatile memory devices generally include Electrically Programmable Read Only Memory (EPROM), Electrically Erasable and Programmable Read Only Memory (EEPROM), flash EEPROM and so on. In recent years, memory has been formed to have a Silicon/Oxide/Nitride/Oxide/Silicon (SONOS) structure having a three-layered gate insulating layer of an oxide layer/a nitride layer/an oxide layer. If this SONOS structure is used, a non-volatile memory device with low voltage, low consumption power, and high-speed operation can be manufactured. It can also increase the level of integration in devices. The operating principle of the non-volatile memory device having this SONOS structure is described below.

The non-volatile memory device of the SONOS structure utilizes the electrical potential difference between an oxide layer and a nitride layer. Electrons trapped at the nitride layer are not lost due to a potential barrier formed by the underlying and overlaying oxide layers although power is off, and maintains its non-volatile property. Programming is performed by applying a voltage through which electrons can tunnel the thin oxide layer existing below the nitride layer, and reading is carried out by discriminating the driving current difference caused by the difference in transistor threshold voltage using a differential amplifier.

Meanwhile, in order to implement this SONOS structure, before the dielectric layer of the three-layered structure is formed in a cell region, a gate insulating layer and a polysilicon layer are formed in a peripheral region. That is, a cell gate including a dielectric layer and a conductive layer is formed in the cell region, and a gate including the gate insulating layer, the polysilicon layer, a dielectric layer and a conductive layer is formed in the peripheral region. The gate formed in the peripheral region includes the polysilicon layer, so that a step due to the polysilicon layer is generated between the cell region and the peripheral region. A SAC nitride layer and an interlayer insulating layer are formed over a semiconductor substrate including the cell gate and the gate. A polishing process is performed on the interlayer insulating layer. The SAC nitride layer formed over the gate of the peripheral region is exposed anterior to the SAC nitride layer formed over the cell gate of the cell region due to the step. For this reason, the SAC nitride layer formed over the gate of the peripheral region can be removed during the polishing process. It results in an increased leakage current of a high voltage transistor of the peripheral region. Furthermore, a hump characteristic is generated due to the leakage current, and malfunction of the high voltage transistor may occur due to variation in the threshold voltage of the high voltage transistor.

BRIEF SUMMARY OF THE INVENTION

Accordingly, the present invention discloses a method of manufacturing a non-volatile memory device, in which it can reduce a step between a cell region and a peripheral region in such a manner that the amount of a hard mask, which is lost at the time of etching, can be compensated for by thickly forming the hard mask when a gate is laminated.

In an aspect, a method of manufacturing a non-volatile memory device, including the steps of forming a gate insulating layer and a first conductive layer in a peripheral region of a semiconductor substrate, forming a dielectric layer and a second conductive layer over the semiconductor substrate of a cell region and the first conductive layer of the peripheral region, forming a hard mask over the second conductive layer, patterning the hard mask, the second conductive layer, and the dielectric layer of the cell region to form a first gate pattern, patterning the hard mask of the peripheral region, etching the hard mask of the peripheral region so that a step between the cell region and the peripheral region is decreased, and forming a second gate pattern in the peripheral region by an etch process employing the patterned hard mask.

In other aspect, a method of manufacturing a non-volatile memory device, including the steps of providing a semiconductor substrate having a cell region and a peripheral region, in which a first gate pattern is formed over the cell region and a second gate pattern is formed over the peripheral region, with a hard mask being formed over the first and second gate patterns, and removing a portion of the hard mask formed over the first gate pattern or the second gate pattern to reduce topology between the cell region and the peripheral region.

DESCRIPTION OF SPECIFIC EMBODIMENTS

A specific embodiment according to the present patent will be described with reference to the accompanying drawings.

Figure 1:
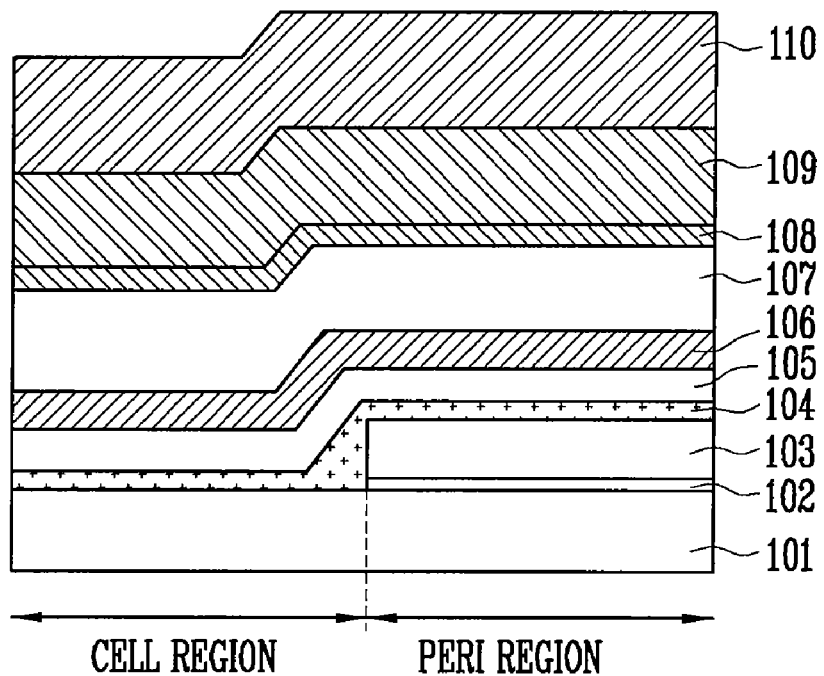
FIGS. 1 to 7 are cross-sectional views illustrating a method of manufacturing a non-volatile memory device according to an embodiment of the present invention.

Referring to FIG. 1, a gate insulating layer 102 and a first conductive layer 103 are formed in a peripheral region of a semiconductor substrate 101. A dielectric layer 104, a capping polysilicon layer 105, a second conductive layer 106, a tungsten silicide layer 107, a SiON layer 108, a hard mask 109 and a carbon hard mask 110 are sequentially laminated over the semiconductor substrate including the first conductive layer 103. The first conductive layer 103 and the second conductive layer 106 are formed from polysilicon. The gate insulating layer 102 and the first conductive layer 103 can be formed to a thickness of about 70 and 800 angstroms, respectively. Furthermore, the dielectric layer 104 can have an ONO (oxide-nitride-oxide) structure. The ONO structure comprises a lamination structure of a lower oxide layer, a nitride layer and an upper oxide layer. In this case, the lower oxide layer, the nitride layer and the upper oxide layer can be formed to a thickness of about 40, 40 and 65 angstroms, respectively. The capping polysilicon layer 105, the second conductive layer 106, the tungsten silicide layer 107 and the SiON layer 108 can be formed to a thickness of about 300, 400, 1100 and 200 angstroms, respectively. The hard mask 109 is formed to a thickness of about 1200 to 1500 angstroms to reduce a step at an interface between the cell region and the peripheral region. The carbon hard mask 110 can be formed to a thickness of about 2000 angstroms.

Figure 2:
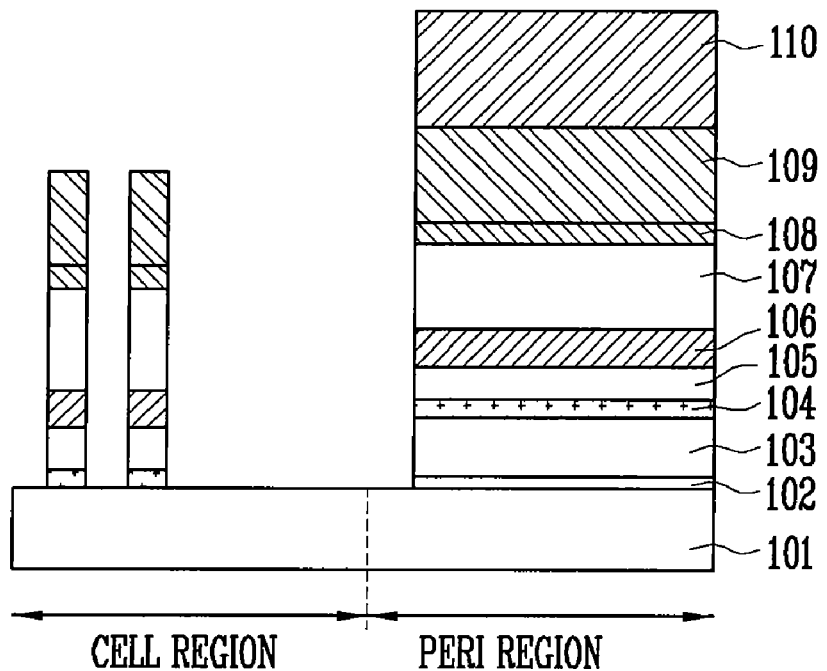

Referring to FIG. 2, an etch process employing a gate mask (not illustrated) is performed to form a gate pattern in the cell region.

Figure 3:
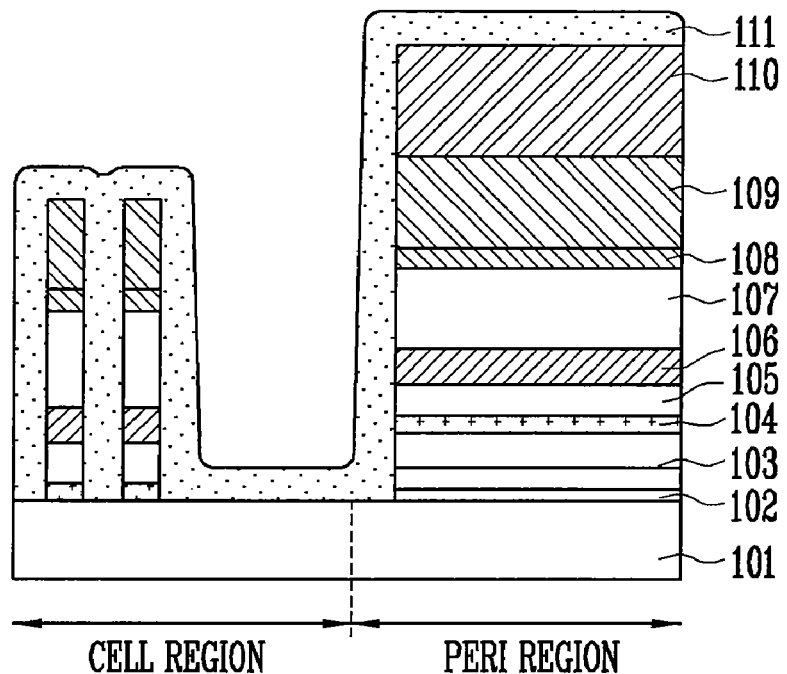

Referring to FIG. 3, a buffer oxide layer 111 is formed on the entire surface including the gate pattern in the cell regions.

Figure 4:
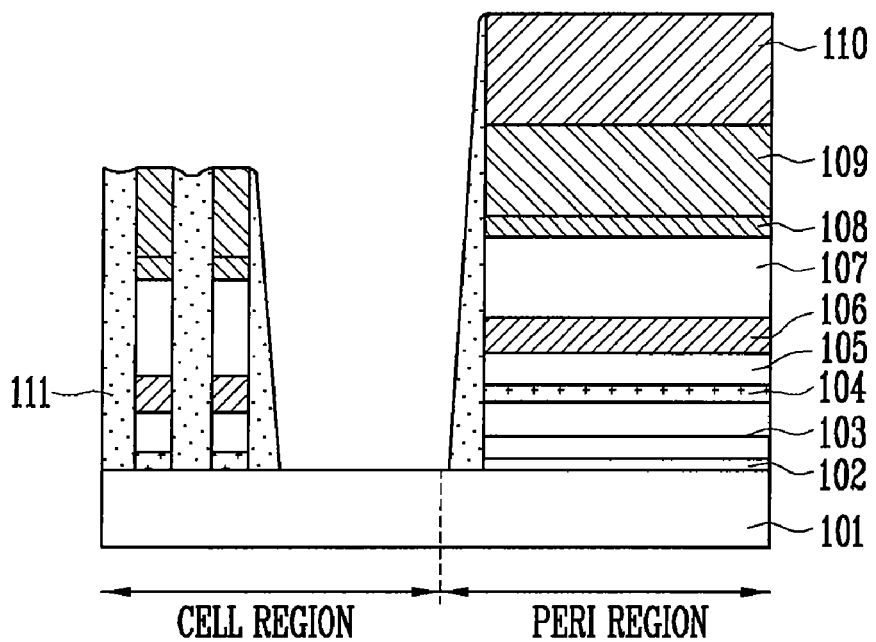

Referring to FIG. 4, the buffer oxide layer 111 is etched until the hard mask 109 of the cell region and the carbon hard mask 110 of the peripheral region are exposed. Thus, the buffer oxide layer 111 remains on the gate sidewalls of the cell region and the peripheral region.

Figure 5:
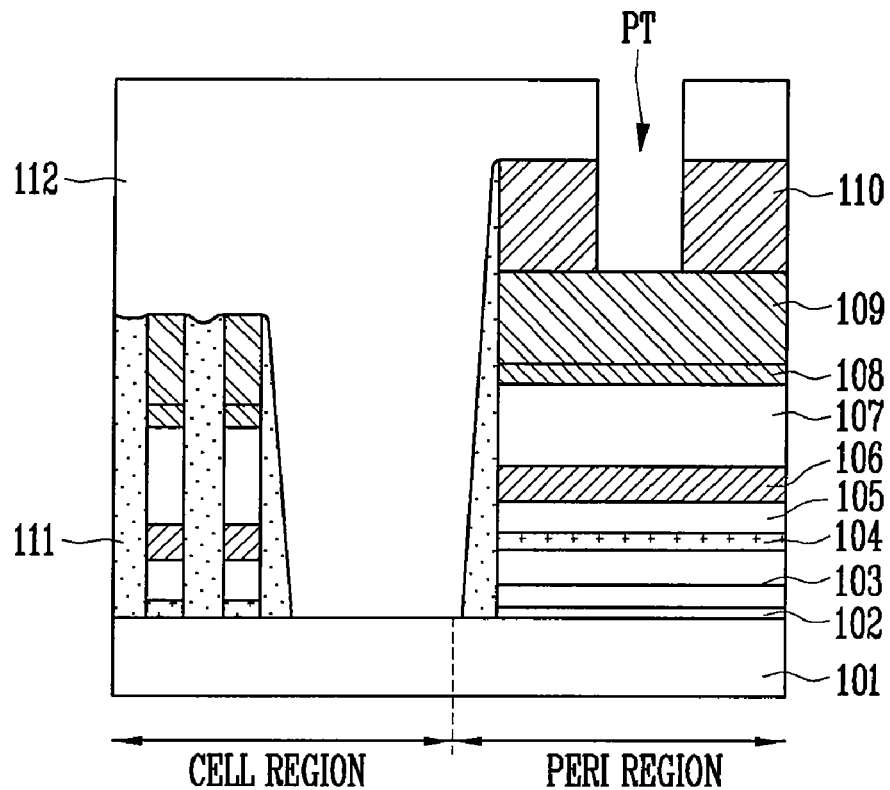

Referring to FIG. 5, a gate mask pattern 112 is formed on the entire structure. The carbon hard mask layer 110 is patterned along with the gate mask pattern 112.

Figure 6:
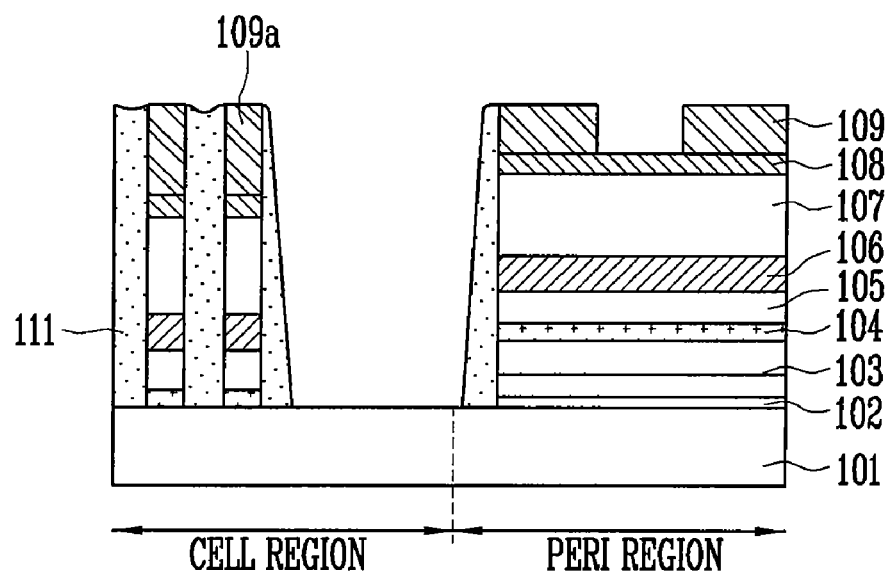

Referring to FIG. 6, after the hard mask 109 of the peripheral region is removed along the gate mask pattern 112, the carbon hard mask layer 110 of the gate mask pattern 112 and the peripheral region is removed. Only the peripheral region is exposed by using a peripheral open mask (not illustrated) is exposed and the hard mask 109 of the peripheral region is removed by a wet or dry etch process to a thickness of about 600 to 800 angstrom. Consequently, the thickness of the hard mask 109 of the peripheral region becomes thinner than that of the hard mask 109 of the cell region. In other words, the thickness of the hard mask 109 of the peripheral region is decreased as much as the thickness of the first conductive layer 103 formed in the peripheral region. Accordingly, the step between the cell region and the peripheral region can be minimized.

Figure 7:
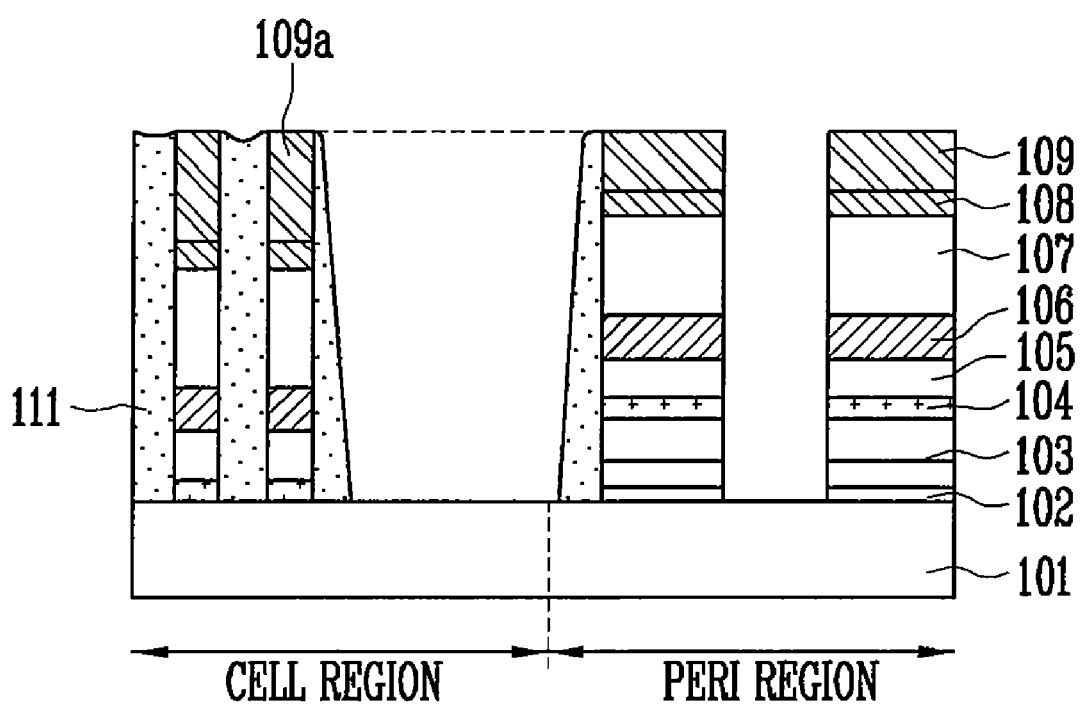

Referring to FIG. 7, a gate pattern is formed by using the hard mask 109 of the peripheral region. Accordingly, the gate height of the peripheral region becomes the same or a little higher than that of the cell region. Thus, a nitride layer (not illustrated) can be prevented from being exposed even if a polishing process is performed after a subsequent nitride layer (not illustrated) and a subsequent interlayer insulating layer (not illustrated) are formed.

In a non-volatile memory device, a height of the gate pattern in the cell region may be higher than that of the gate pattern in the peripheral region. In this case, a portion of the hard mask in the cell region is etched to reduce topology between the cell region and the peripheral region.

As described above, according to the present invention, the step between the cell region and the peripheral region can be decreased since the hard mask of the cell region is thickly formed. Accordingly, a nitride layer can be prevented from being exposed at the time of a CMP process after a subsequent interlayer insulating layer is formed, and the leakage of the peripheral region gate can be prevented accordingly.

Although the foregoing description has been made with reference to the specific embodiment, it is to be understood that changes and modifications of the present patent may be made by the ordinary skilled in the art without departing from the spirit and scope of the present patent and appended claims.

What is claimed is:

1. A method of manufacturing a non-volatile memory device, comprising:
    forming a gate insulating layer and a first conductive layer in a peripheral region of a semiconductor substrate;
    forming a dielectric layer and a second conductive layer over the semiconductor substrate of a cell region and the first conductive layer of the peripheral region;
    forming a hard mask over the second conductive layer;
    patterning the hard mask, the second conductive layer, and the dielectric layer of the cell region to form a first gate pattern;
    patterning the hard mask of the peripheral region;
    etching the hard mask of the peripheral region so that a step between the cell region and the peripheral region is decreased; and
    forming a second gate pattern in the peripheral region by an etch process employing the patterned hard mask.

2. The method of claim 1, wherein the hard mask is formed to a thickness of about 1200 to 1500 angstrom.

3. The method of claim 1, wherein the hard mask of the peripheral region is etched to a thickness of 600 to 800 angstrom.

4. The method of claim 1, further comprising forming a buffer oxide layer on sidewalls of the first gate pattern after the first gate pattern is formed.

5. The method of claim 1, wherein a capping polysilicon layer is further formed between the dielectric layer and the second conductive layer.

6. The method of claim 1, wherein the patterning of the hard mask is carried out with a carbon hard mask being formed on the hard mask.

7. The method of claim 1, wherein a tungsten silicide layer and a SiON layer are further formed between the second conductive layer and the hard mask.

8. The method of claim 1, wherein the first and second conductive layers are formed from polysilicon.

9. The method of claim 1, wherein the dielectric layer has an ONO structure.

10. A method of manufacturing a non-volatile memory device, comprising:
    forming a first gate pattern including a first hard mask over a cell region and a second gate pattern including a second hard mask over a peripheral region of a semiconductor substrate, wherein a portion of the semiconductor substrate between the first gate pattern and the second gate pattern is exposed;
    patterning a portion of the hard mask formed over the first gate pattern or the second gate pattern to reduce topology of the cell region and the peripheral region; and
    patterning the first gate pattern or the second gate pattern using the patterned hard mask.

* * * * *